US009984039B2

(12) United States Patent
Ragnoli et al.

(10) Patent No.: US 9,984,039 B2
(45) Date of Patent: May 29, 2018

(54) DOMAIN DECOMPOSITION FOR TRANSPORT TRAJECTORIES IN ADVECTION DIFFUSION PROCESSES

(71) Applicant: International Business Machines Corporation, Armonk, NY (US)

(72) Inventors: Emanuele Ragnoli, Dublin (IE); Sergiy Zhuk, Dublin (IE)

(73) Assignee: International Business Machines Corporation, Armonk, NY (US)

( * ) Notice: Subject to any disclaimer, the term of this patent is extended or adjusted under 35 U.S.C. 154(b) by 917 days.

(21) Appl. No.: 14/496,100

(22) Filed: Sep. 25, 2014

(65) Prior Publication Data

US 2016/0092610 A1 Mar. 31, 2016

(51) Int. Cl.
| | | |
|---|---|---|
| *G06F 17/10* | (2006.01) | |
| *G06F 17/13* | (2006.01) | |
| *G06F 17/50* | (2006.01) | |

(52) U.S. Cl.
CPC .............. *G06F 17/10* (2013.01); *G06F 17/13* (2013.01); *G06F 17/5018* (2013.01); *G06T 2210/24* (2013.01)

(58) Field of Classification Search
CPC ................................................ G06T 2210/24
See application file for complete search history.

(56) References Cited

U.S. PATENT DOCUMENTS

| | | | |
|---|---|---|---|
| 7,610,183 B2 | 10/2009 | Danko | |
| 8,396,693 B2 | 3/2013 | Danko | |
| 2004/0254740 A1* | 12/2004 | Ohba | ...................... G01W 1/00 |
| | | | 702/26 |
| 2007/0150245 A1 | 6/2007 | Pomraning et al. | |
| 2011/0242095 A1* | 10/2011 | Tsunoda | .............. G06F 17/5018 |
| | | | 345/419 |
| 2012/0203461 A1 | 8/2012 | Chan et al. | |
| 2013/0179078 A1 | 7/2013 | Griffon | |
| 2013/0211796 A1* | 8/2013 | Aquelet | .............. G06F 17/5018 |
| | | | 703/2 |

FOREIGN PATENT DOCUMENTS

| | | |
|---|---|---|
| CN | 202869935 U | 4/2013 |
| WO | 2013085567 A1 | 6/2013 |

OTHER PUBLICATIONS

Baptista et al., "Eulerian-Lagrangian Analysis of Pollutant Transport in Shallow Water" (Jun. 1984), pp. 1-140 [retrieved from https://dspace.mit.edu/bitstream/handle/1721.1/60596/EL_TR_1984_008.pdf?sequence=1].*

(Continued)

*Primary Examiner* — Brian W Wathen
(74) *Attorney, Agent, or Firm* — Stephen R. Yoder

(57) ABSTRACT

Efficient prediction of trajectories of pollutants in a fluid is accomplished by automatic activation and deactivation of sub-domains within the mesh representing the body of fluid in question. Activation and deactivation are triggered by the transport characteristics of the pollutant, that is, the sub-domains are activated as the pollutant enters a sub-domain and deactivated as the pollutant exits a sub-domain.

18 Claims, 4 Drawing Sheets

(56) References Cited

OTHER PUBLICATIONS

Azamathulla et al., "Support vector machine approach for longitudinal dispersion coefficients in natural streams", Applied Soft Computing, 2011, doi: 10.1016/j.asoc.2010.11.026, © 2010 Elsevier B.V.

Fosberg et al., "Modelling wind and transport patterns at Aramoana", New Zealand Journal of Science, 1984, vol. 27, pp. 337-353, © Crown Copyright 1984.

Hamrick, John M., "A Three-Dimensional Environmental Fluid Dynamics Computer Code: Theoretical and Computational Aspects", Virginia Institute of Marine Science, May 1992, pp. 1-58.

Nakshatrala et al., "A FETI-based domain decomposition technique for time-dependent first-order systems based on a DAE approach", International Journal for Numerical Methods in Engineering, Published online Feb. 8, 2008 in Wiley InterScience, DOI: 10.1002/nme.2303, Copyright © 2008 John Wiley & Sons, Ltd.

SPI DST et al., "An Asymptotic Induced Numerical Method for the Convection-Diffusion-Reaction Equation" An IP.com Prior Art Database Technical Disclosure, IP.com No. IPCOM000149317D, Original Publication Date: Dec. 30, 1899, IP.com Electronic Publication: Apr. 13, 2007, pp. 1-31, Database entry Copyright (c) Software Patent Institute.

\* cited by examiner

DOMAIN DECOMPOSITION FOR TRANSPORT TRAJECTORIES IN ADVECTION DIFFUSION PROCESSES

FIELD OF THE INVENTION

The present invention relates generally to the field of simulation models, and more particularly to transport trajectories in advection diffusion processes.

BACKGROUND OF THE INVENTION

Advection is a transport mechanism of a substance or conserved property by a fluid, due to the fluid's bulk motion. An example of advection is the transport of pollutants or silt in a river by bulk water flow downstream. The advection diffusion equation is a combination of the diffusion and convection equations. It describes physical phenomena where particles, energy, or other physical quantities are transferred inside a physical system due to two processes: diffusion, and convection.

Minimax (also referred to as MinMax) is a decision rule used in decision theory, game theory, statistics, and philosophy for minimizing the possible loss for a worst case (maximum loss) scenario. This decision rule is often applied to general decision making in the presence of uncertainty.

Planning remediation strategies, for example, in environmental contamination, simulated transport in an advection diffusion process is relied upon for predicting, or forecasting, transport trajectories. In such applications, the choice of domain, or environment, for the numerical simulation is an important component in prediction abilities of an operating model. For example, the choice of domain for the numerical simulation is a key point for the correctness of the prediction system. That is, a small domain may deteriorate the prediction, while a large domain may be computationally unfeasible.

The generation of domains and sub-domains is generally determined by the user of the system, or by the domain expert that is doing the simulation. Typically, the mesh generated covers the physical domain that is to be simulated and the sub-domains are consequently generated depending upon the computational facilities available to the user. The only constraint is that the sub-domains must not overlap.

SUMMARY

In one aspect of the present invention, a method, a computer program product, and a system for predicting a transport trajectory based on an advection diffusion model includes: defining a first set of active sub-domains of a full-domain mesh representing a fluid medium, simulating a first transport trajectory of a pollutant within the first set of active sub-domains, determining the presence of the pollutant within a sub-domain based on the transport trajectory, and defining a second set of active sub-domains based, at least in part, upon the presence of the pollutant within the sub-domain.

DETAILED DESCRIPTION

Figure 1:
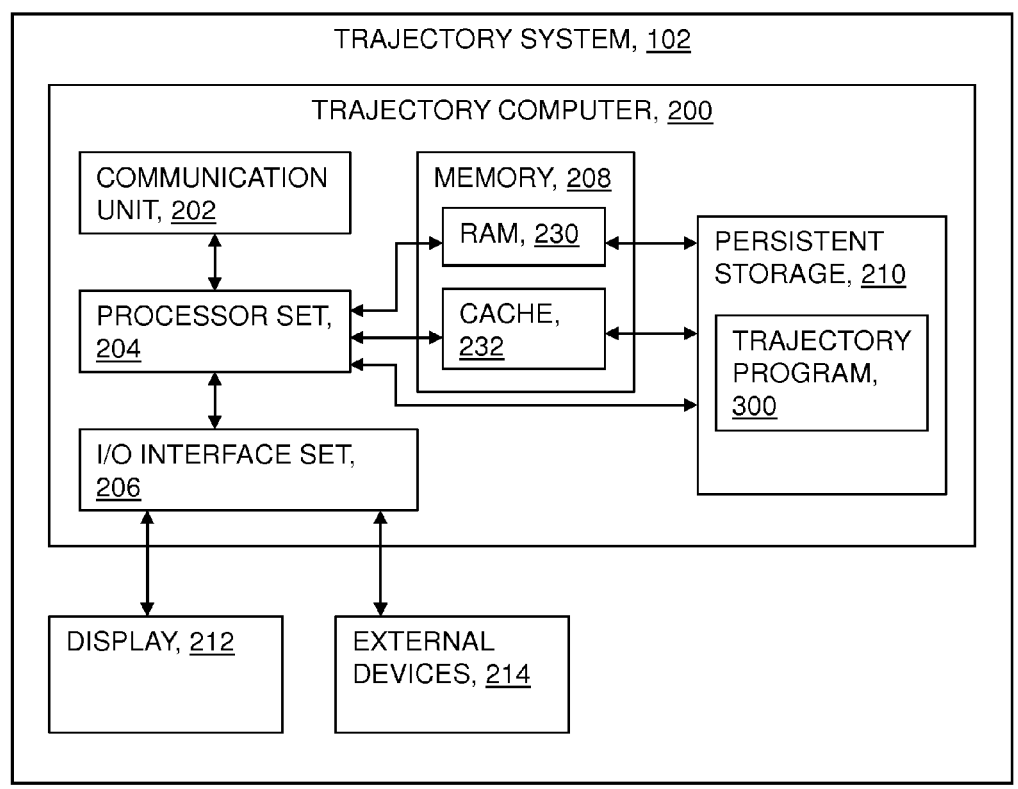
FIG. 1 is a schematic view of a first embodiment of a system according to the present invention.

Efficient prediction of trajectories of pollutants in a fluid is accomplished by automatic activation and deactivation of sub-domains within the mesh representing the body of fluid in question. Activation and deactivation are triggered by the transport characteristics of the pollutant, that is, the sub-domains are activated as the pollutant enters a sub-domain and deactivated as the pollutant exits a sub-domain. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium, or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network, and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions, or acts, or carry out combinations of special purpose hardware and computer instructions.

The present invention will now be described in detail with reference to the Figures. FIG. 1 is a functional block diagram illustrating various portions of trajectory system 102, in accordance with one embodiment of the present invention, including: trajectory computer 200; communication unit 202; processor set 204; input/output (I/O) interface set 206; memory device 208; persistent storage device 210; display device 212; external device set 214; random access memory (RAM) devices 230; cache memory device 232; and trajectory program 300.

Sub-system 102 is, in many respects, representative of the various computer sub-system(s) in the present invention. Accordingly, several portions of sub-system 102 will now be discussed in the following paragraphs.

Trajectory system 102 may be a laptop computer, tablet computer, netbook computer, personal computer (PC), a desktop computer, a personal digital assistant (PDA), a smart phone, or any programmable electronic device. Program 300 is a collection of machine readable instructions and/or data that is used to create, manage, and control certain software functions that will be discussed in detail below.

System 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware component within a system. For example, the communications fabric can be implemented, at least in part, with one or more buses.

Memory 208 and persistent storage 210 are computer readable storage media. In general, memory 208 can include any suitable volatile or non-volatile computer readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions, and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either, or both, physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer readable storage media such as, for example, thumb drives, portable optical or magnetic disks, and memory cards. Software and data used to practice embodiments of the present invention, for example, program 300, can be stored on such portable computer readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the present invention. However, it should be appreciated that any particular program nomenclature herein is used merely for convenience, and thus the present invention should not be limited to use solely in any specific application identified and/or implied by such nomenclature.

Trajectory program 300 operates to estimate and/or predict the trajectories of transport in advection diffusion processes, such as the transport of pollutants in a marine environment. Pollutants found in either compressible or incompressible fluids are tracked by the advection diffusion model. Examples of pollutants in fluids include: (i) oil in water; and (ii) volcanic ash in the atmosphere.

Some embodiments of the present invention employ a strategy for domain decomposition that supports the generation of an accurate forecast with reasonable computational effort. Domain decomposition, as discussed herein, amends the lack of, or corruption of, existing data in the assimilation phase of the numerical simulation. For example, when using satellite images in forecasting pollutant trajectories in a marine environment, the images may be incomplete due to cloud coverage. Some embodiments of the present invention identify and/or track pollutant trajectories, or, generally, transport trajectories, when supporting data is incomplete, or otherwise unavailable. The forecasting component of such a model relies on the embedding of data assimilation techniques. These data assimilation techniques are able to make up for low sampling rates in sensor data, or measurements. The forecasting system, or model, should be able to combine calculated information represented by the numerical model and noisy and/or incomplete observations.

Conventional forecasting of transport trajectories is achieved through the use of algorithms that have been developed to predict and/or track transport trajectories in a given environment, or domain. Example approaches include: (i) Lagrangian approaches; (ii) superimposition of transport equations on ocean or atmospheric models; and/or (iii) data-driven statistical approaches. Conventional approaches like (i) and (iii) are computationally inexpensive, but less accurate in the forecast of complex transport patterns. In other cases, the conventional approaches are computationally demanding, and the choice of an appropriate boundary condition complicates the implementation of the model. Still further, some conventional approaches are highly inaccurate in the case of noisy and/or incomplete observation data.

Some embodiments of the present invention operate with a "full domain" that covers an area of interest and a set of non-overlapping "sub-domains" whose union extends over the full domain. An advection diffusion model that covers the full domain is employed to determine a set of sub-domains containing the transport material. That is, the advection diffusion model is applied to the full domain and then a set of reduced models are activated on the corresponding activated sub-domains. For example, in a marine environment, a hydrodynamic model for the full domain is used.

A simple use case follows and will be referred to throughout the next several paragraphs to facilitate understanding. Applications of the present invention have far-reaching impact for complex systems of transport trajectories in a fluid medium. For the use case, consider a glass of water and ink dropper. The water in the glass may be virtualized as a three-dimensional mesh with a cylindrical glass boundary, a glass boundary at one end, and a boundary at the other end controlled at least in part by atmospheric pressure. In this example, the mesh is divided into two sub-domains, the upper and lower sub-domains. As a drop of ink is placed into the water, a simulated ink pollutant enters the upper sub-domain of the water mesh. Using an advection diffusion model for the water, and in conjunction with an embodiment of the present invention, the upper sub-domain is activated for tracking movement of the ink. When the advection diffusion model is advanced to when the ink enters the lower sub-domain, the lower sub-domain is activated for tracking the ink. When the model later determines that there is no more ink in the upper sub-domain, the upper sub-domain is deactivated. This is a simple example of how various sub-domains of a region represented by a mesh are individually activated to efficiently track the trajectory of a pollutant. As discussed above, it is conventional to calculate the model on the entire mesh for each movement of the pollutant.

Figure 2:
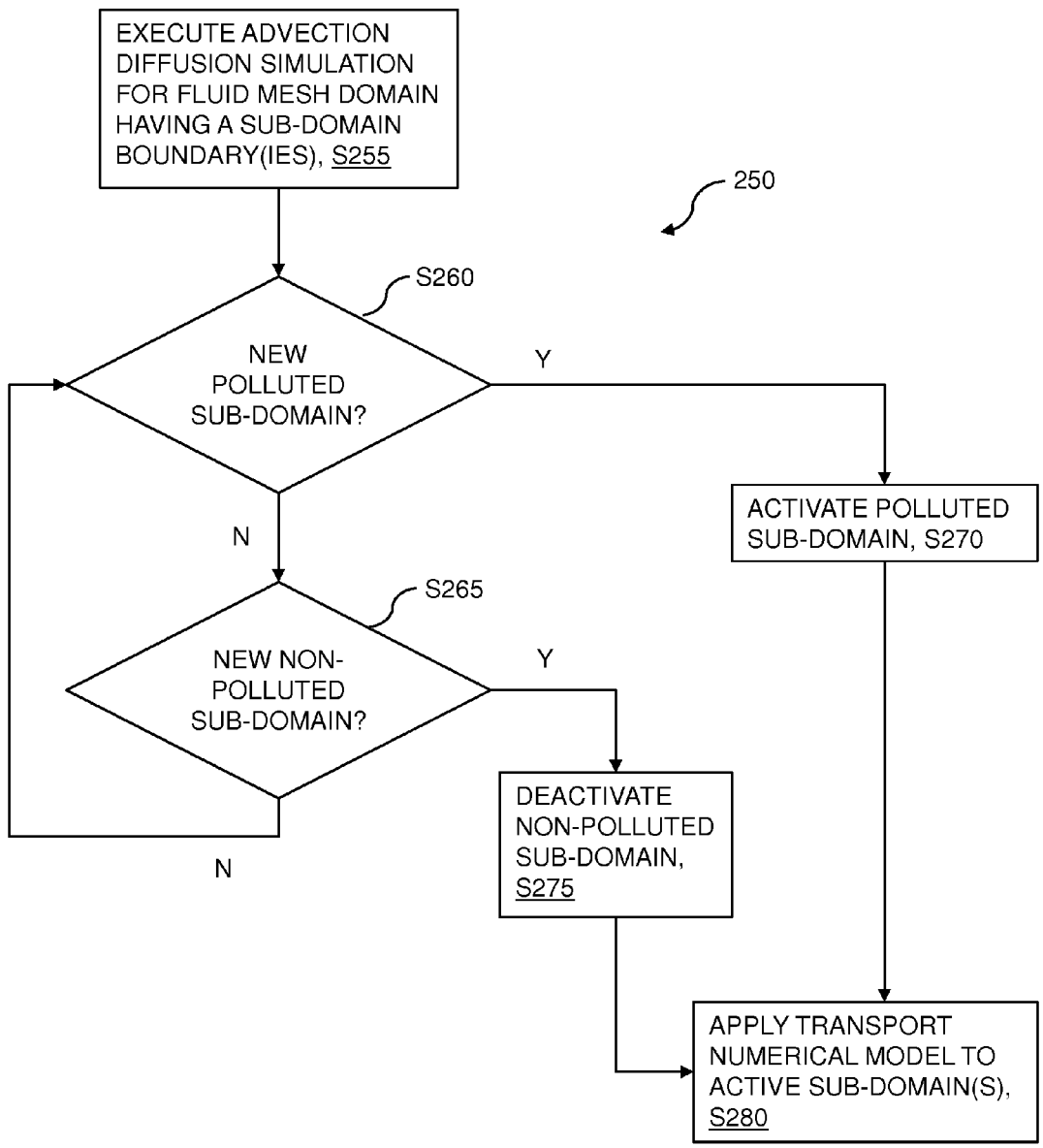
FIG. 2 is a flowchart showing a method performed, at least in part, by the first embodiment system.
Figure 3:
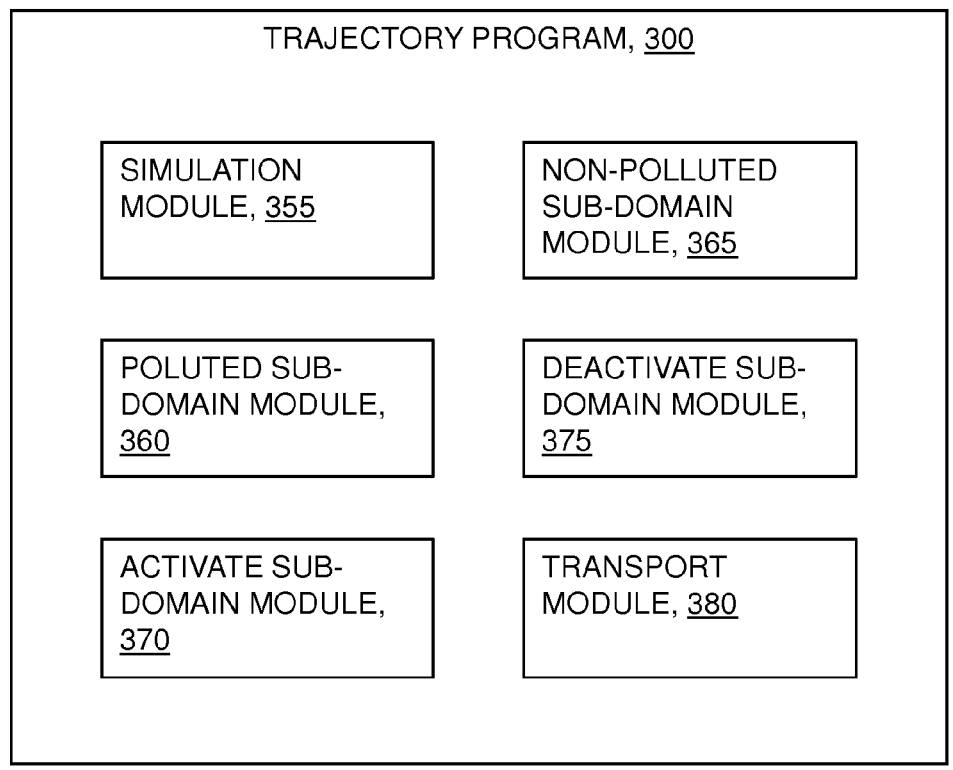
FIG. 3 is a schematic view of a machine logic (for example, software) portion of the first embodiment system.

FIG. 2 shows flowchart 250 depicting a first method according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

Processing begins at step S255, where simulation module 355 executes the advection diffusion simulation for a fluid mesh domain having a sub-domain boundary(ies). In the above use case, this step would execute an advection diffusion simulation for the entire glass of water.

Processing proceeds to step S260, where polluted sub-domain module 360 determines whether a new polluted sub-domain exists according to the executing simulation. If a new polluted sub-domain is determined, processing proceeds to step S270, the "Yes" branch. See the definitions, below, for a definition of "polluted sub-domain." If it is determined that there is no new polluted sub-domain, processing proceeds to step S265, the "No" branch. In this example, the "yes" branch will be triggered when the ink drops into the glass of water.

Following, for now, the "Yes" branch, processing proceeds to step S270, where activate sub-domain module 370 activates the polluted sub-domain determined to be a new polluted sub-domain in step S260. In this example, the upper sub-domain is activated upon determination that a drop of ink entered the upper sub-domain of the mesh.

Following the "No" branch, from step S260, processing proceeds to step s265, where non-polluted sub-domain module 365 determines whether a new non-polluted sub-domain exists according to the executing advection diffusion simulation. If a new non-polluted sub-domain is determined, processing proceeds to step S275, the "Yes" branch. See the definitions, below, for a definition of "non-polluted sub-domain." If it is determined that there is no new non-polluted sub-domain, processing returns to step S260, the "No" branch.

Following the "Yes" branch, processing proceeds to step S275, where deactivate sub-domain module 375 deactivates the non-polluted sub-domain that was determined to be a new non-polluted sub-domain in step S265. In this example, the "yes" branch is triggered when the drop of ink not only reaches the lower sub-domain of the mesh, but once a pre-determined quantity of ink is no longer present in the upper sub-domain. When that occurs, the "yes" branch is triggered and the upper sub-domain is deactivated.

Processing ends at step S280, to where both "Yes" branches from steps S260 and S265 eventually lead. In step S280, transport module 380 applies a transport numerical model to the active sub-domains to efficiently track the pollutants according to the advection diffusion model. While this illustrated process is not iterative, in some embodiments of the present invention processing returns to step S260 after completion of step S280, in that way, continued monitoring for new polluted and non-polluted sub-domains during the simulation process. It should be understood in this simple example that at some point during the simulation process an iterative approach of activating and deactivating sub-domains will result in some period of time where both the upper and lower sub-domains are active. For larger, more commercially practical examples, more efficiency is apparent as oftentimes some sub-domains may never be activated. The initial simulation where all sub-domains are active is performed to identify which sub-domains should remain active. Some embodiments of the present invention deactivate all sub-domains other than the one or more sub-domains activated due to determination that those sub-domain(s) are polluted sub-domain(s).

Further embodiments of the present invention are discussed in the paragraphs that follow.

Figure 4:
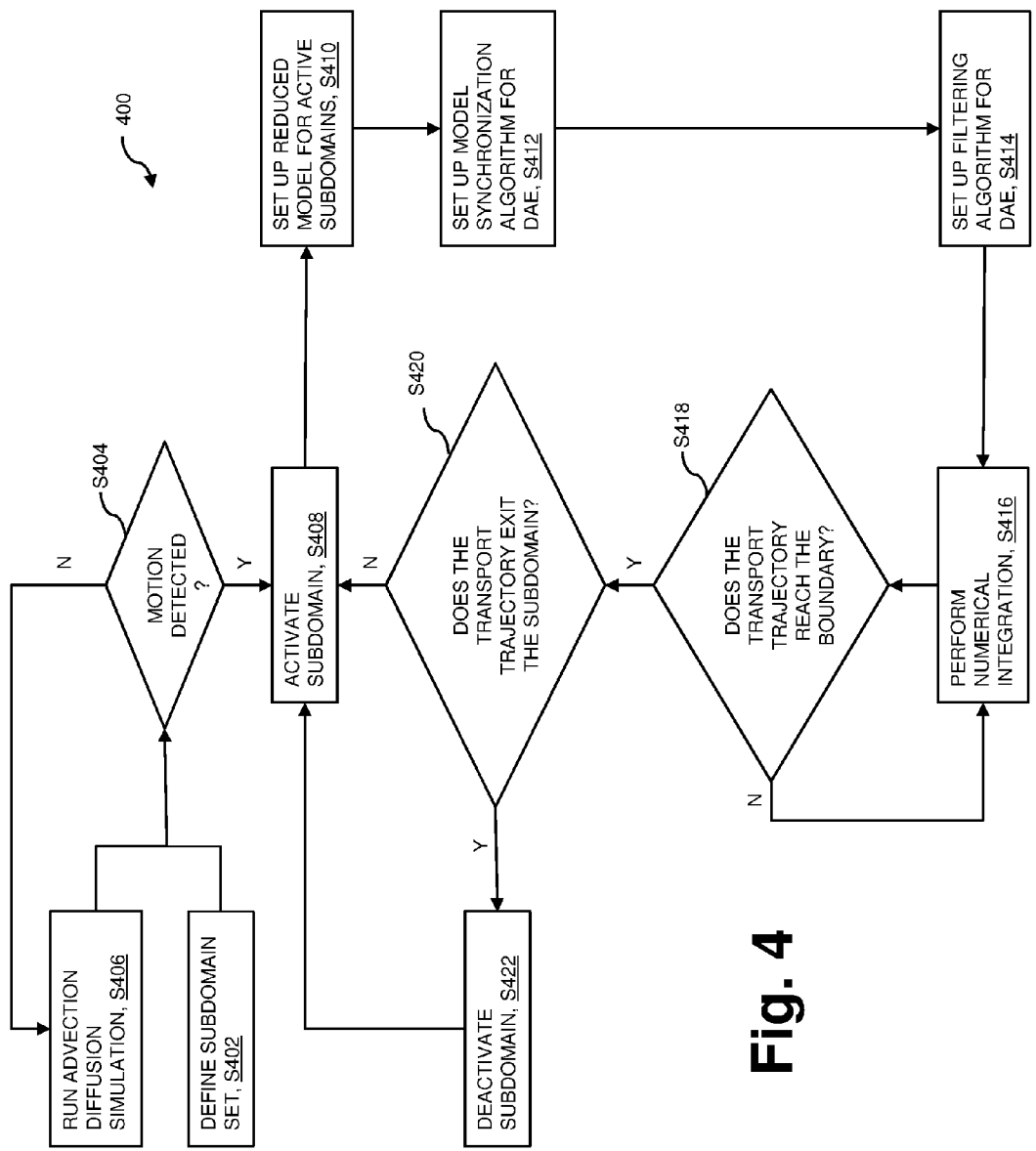
FIG. 4 is a flowchart showing a method performed according to an embodiment of the present invention.

FIG. 4 shows flowchart 400 depicting a second method according to an embodiment of the present invention. The method that follows is useful at least in determining a forecast for a transport trajectory in an advection diffusion process.

Processing begins at step S402, where a set of sub-domains are selected from among the full domain in question. The set of sub-domains are pre-selected and input into this embodiment of the present invention. Alternatively, all sub-domains are selected as an initial state. In this step and with reference to the advection diffusion model, a reduced transport model in the specific sub-domain(s) is determined.

Processing proceeds to decision step S404, where motion may be detected. The motion that is being detected is that of a specified pollutant within the fluid (represented by a full domain mesh). Until the time that motion is detected, processing proceeds, via the "No" branch, to step S406, where an advection diffusion simulation runs based on the selected set of sub-domains. When motion is detected, processing proceeds to step S408, the "Yes" branch. In step S408, the sub-domains corresponding to the motion are activated. That is, once the forecasted transport trajectory reaches a boundary of the subdomain, any adjacent sub-domain is activated.

Processing proceeds to step S410, where a trajectory model, reduced to correspond to only active sub-domains, is set up.

Processing proceeds to step S412, where the reduced transport model(s) from step S410 are synchronized with an algorithm that uses discrete algebraic equations (DAE).

Processing proceeds to step S414, where the discrete algebraic equations are filtered by applying a "minimax" decision rule to the measurements acquired in the various sub-domains.

Processing proceeds to step S416, where numerical integration is performed to predict the transport trajectory.

Processing proceeds to decision step S418, where the transport trajectory may reach a sub-domain boundary. So long as the transport trajectory predicted in step S416 does not reach a sub-domain boundary, processing follows the "No" branch, which returns to step S414 where numerical integration is performed. When the predicted transport trajectory reaches a sub-domain boundary, processing follows the "Yes" branch, to decision step S420.

In decision step S420, it is determined whether or not the transport trajectory exits an active sub-domain. So long as the transport trajectory does not exit the active sub-domain, processing follows the "No" branch, returning to step S408. When it is determined that the transport trajectory exits an active sub-domain, processing follows the "Yes" branch to step S422.

In step S422, the exited active sub-domain is deactivated. The procedure described in steps S404 through S422 is repeated throughout the advection diffusion simulation process, activating and/or deactivating sub-domains as appropriate. By managing the active sub-domains in this way, computational efficiency is improved with respect to a system that runs a simulation using the full domain, or even a static set of sub-domains.

In this exemplary embodiment, the advection diffusion model determines that a trajectory has reached the boundary of a sub-domain. The model simulates the trajectory of the pollutant and once the trajectory reaches a boundary an alert is raised and the system activates the computation on the next adjacent sub-domain. Further, the advection diffusion model operates to determine that a transport material has exited a sub-domain by simulating the motion of the pollutant.

Some embodiments of the present invention use the domain decomposition algorithm that follows. The algorithm begins with receiving the physical domain as data input. Processing proceeds to triangulating the domain and, then, splitting the triangulation into a set of sub-domains. Processing ends with generating a finite element structure based on a set of ordinary differential equations (ODEs) represented by mass and stiffness matrices over each sub-domain.

Some embodiments of the present invention use the model synchronization algorithm DAE that follows. Processing begins with collecting advection diffusion models corresponding to any active sub-domains. Processing proceeds to identifying the interfaces between adjacent sub-domains. Processing proceeds to setting up a Steklov equation for each identified interface. The Stelov equation is set up in the form of an algebraic equation. Processing proceeds to assembling the finite element ODEs, generated by a domain decomposition algorithm, and the algebraic equation(s) together. Processing ends with generating a DAE output.

Some embodiments of the present invention use the filtering algorithm that follows for the DAE output. Processing begins by setting up a new observation operator (if the activated/deactivated sub-domains contained sensors). Processing proceeds to generating matrices for a Riccati equation and a minimax estimator.

Some embodiments of the present invention perform automatic domain decompostion in transport trajectory problems for advection diffusion processes to effectively reduce the computational expense relative to conventional methods. Some embodiments of the present invention use a minimax filter for the assimilation of measurements in the sub-domain transport models. Some embodiments of the present invention manage uncertainties in both transport models and in observed measurements. Some embodiments of the present invention automatically create sub-domains while tracking forecasted transport trajectories. Some embodiments of the present invention automatically alert a user when the forecasted transport trajectory reaches predetermined boundaries.

Some embodiments of the present invention provide a system that estimates and predicts the trajectories of transport in advection diffusion processes. The system includes a process including one, or more, of the following steps: (i) take into account uncertainties in forecasted trajectories of a transport numerical model in a advection diffusion process; (ii) take into account uncertainties of the models and of the observations; (iii) compute the forecast of the transport trajectories; (iv) adaptively generate the mesh for the transport numerical model; (v) alert a user when the transport trajectories reach predetermined boundaries within the selected domain; and (vi) automatically activate/deactivate subdomains once the transport trajectories enter/leave a particular subdomain. Step (vi) does not mean to say that the mesh is automatically, or adaptively generated, rather, it means that the computations of the transport equation on a specific sub-domain is automatically activated once the pollutant reaches that particular sub-domain. In this example, the sub-domain is a subset of the full domain mesh, and, therefore, the union of the sub-domains covers the full domain mesh. The full domain mesh is generated by a user and the action of splitting the full domain mesh in sub-domains is also accomplished by a user. That is, some embodiments of the present invention are mesh and/or sub-domain independent because they operate with any type of mesh and division of consecutive sub-domains.

Some embodiments of the present invention may include one, or more, of the following features, characteristics and/or advantages: (i) take into account uncertainties in forecasted trajectories of a transport numerical model in an advection diffusion process; (ii) take into account uncertainties of transport numerical models; (iii) take into account uncertainties of sensor measurements and/or other observations; (iv) forecast transport trajectories; (v) adaptively generate the mesh for transport numerical models; (vi) provides an alert when a forecasted transport trajectory reaches a predetermined boundary within a selected domain, or environment, such as a marine environment; (vii) provides an alert when a forecasted transport trajectory reaches a predetermined boundary within a selected sub-domain; (viii) automatically activates a sub-domain when a forecasted transport trajectory enters the sub-domain; (ix) automatically deactivates a sub-domain when a forecasted transport trajectory enters a particular sub-domain; (x) automatically activates a sub-domain when a forecasted transport trajectory leaves a particular sub-domain; (xi) automatically deactivates a sub-domain when a forecasted transport trajectory leaves the sub-domain; (xii) computationally feasible and robust; and/or (xiii) the transport trajectory forecast is done by assimilating measurements and taking into account uncertainties.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Polluted sub-domain: any sub-domain within a simulated mesh domain in which a pre-determined quantity of a tracked pollutant is present.

Non-polluted sub-domain: any sub-domain within a simulated mesh domain in which a predetermined quantity of a tracked pollutant is not present.

What is claimed is:

1. A method for predicting a transport trajectory based on an advection diffusion model, the method comprising:
    defining a first set of active sub-domains of a full-domain mesh representing a fluid medium;
    simulating a first transport trajectory of a pollutant within the first set of active sub-domains;
    determining the presence of the pollutant within a sub-domain based on the transport trajectory; and defining a second set of active sub-domains based, at least in part, upon the presence of the pollutant within the sub-domain;

wherein:

at least the simulating and determining steps are performed by computer software running on computer hardware.

2. The method of claim 1, wherein the step of defining the second set of active sub-domains includes:

responsive to determining the presence of the pollutant within an inactive sub-domain, activating the inactive sub-domain; and adding the activated sub-domain to the set of active sub-domains.

3. The method of claim 2, further comprising:

reporting the determination of the presence of the pollutant within an inactive sub-domain.

4. The method of claim 1, wherein the step of defining the second set of active sub-domains includes:

responsive to determining a lack of presence of the pollutant within an active sub-domain of the set of active sub-domains, deactivating the active sub-domain; and removing the deactivated sub-domain from the set of active sub-domains.

5. The method of claim 1, further comprising:

simulating a second transport trajectory of the pollutant within the second set of active sub-domains.

6. The method of claim 5, wherein the simulating the first transport trajectory includes:

synchronizing the first transport trajectory and the second transport trajectory with an algorithm that uses discrete algebraic equations (DAEs);

filtering the DAEs by applying a "minimax" decision rule to a set of measurements from the first set of active sub-domains and the second set of active sub-domains; and predicting a third transport trajectory by applying numerical integration to the filtered DAEs.

7. A computer program product for predicting a transport trajectory based on an advection diffusion model, the computer program product comprising a computer readable storage medium having stored thereon:

first program instructions programmed to define a first set of active sub-domains of a full-domain mesh representing a fluid medium;

second program instructions programmed to simulate a first transport trajectory of a pollutant within the first set of active sub-domains;

third program instructions programmed to determine the presence of the pollutant within a sub-domain based on the transport trajectory; and fourth program instructions programmed to define a second set of active sub-domains based, at least in part, upon the presence of the pollutant within the sub-domain.

8. The computer program product of claim 7, wherein the fourth program instruction programmed to define the second set of active sub-domains includes:

program instructions programmed to, responsive to determining the presence of the pollutant within an inactive sub-domain, activate the inactive sub-domain; and program instructions programmed to add the activated sub-domain to the set of active sub-domains.

9. The computer program product of claim 8, further comprising:

fifth program instructions programmed to report the determination of the presence of the pollutant within an inactive sub-domain.

10. The computer program product of claim 7, wherein the fourth program instruction programmed to define the second set of active sub-domains includes:

program instructions programmed to, responsive to determining a lack of presence of the pollutant within an active sub-domain of the set of active sub-domains, deactivate the active sub-domain; and program instructions programmed to remove the deactivated sub-domain from the set of active sub-domains.

11. The computer program product of claim 7, further comprising:

fifth program instructions programmed to simulate a second transport trajectory of the pollutant within the second set of active sub-domains.

12. The computer program product of claim 11, wherein the second program instructions programmed to simulate a first transport trajectory of a pollutant within the first set of active sub-domains includes:

program instructions programmed to synchronize the first transport trajectory and the second transport trajectory with an algorithm that uses discrete algebraic equations (DAEs);

program instructions programmed to filter the DAEs by applying a "minimax" decision rule to a set of measurements from the first set of active sub-domains and the second set of active sub-domains; and program instructions programmed to predict a third transport trajectory by applying numerical integration to the filtered DAEs.

13. A computer system for predicting a transport trajectory based on an advection diffusion model, the computer system comprising:

a processor(s) set; and a computer readable storage medium;

wherein:

the processor set is structured, located, connected, and/or programmed to run program instructions stored on the computer readable storage medium; and the program instructions include:

first program instructions programmed to define a first set of active sub-domains of a full-domain mesh representing a fluid medium;

second program instructions programmed to simulate a first transport trajectory of a pollutant within the first set of active sub-domains;

third program instructions programmed to determine the presence of the pollutant within a sub-domain based on the transport trajectory; and fourth program instructions programmed to define a second set of active sub-domains based, at least in part, upon the presence of the pollutant within the sub-domain.

14. The computer system of claim 13, wherein the fourth program instruction programmed to define the second set of active sub-domains includes:

program instructions programmed to, responsive to determining the presence of the pollutant within an inactive sub-domain, activate the inactive sub-domain; and program instructions programmed to add the activated sub-domain to the set of active sub-domains.

15. The computer system of claim 14, further comprising:

fifth program instructions programmed to report the determination of the presence of the pollutant within an inactive sub-domain.

16. The computer system of claim 13, wherein the fourth program instruction programmed to define the second set of active sub-domains includes:
- program instructions programmed to, responsive to determining a lack of presence of the pollutant within an active sub-domain of the set of active sub-domains, deactivate the active sub-domain; and
- program instructions programmed to remove the deactivated sub-domain from the set of active sub-domains.

17. The computer system of claim 13, further comprising:
- fifth program instructions programmed to simulate a second transport trajectory of the pollutant within the second set of active sub-domains.

18. The computer system of claim 17, wherein the second program instructions programmed to simulate a first transport trajectory of a pollutant within the first set of active sub-domains includes:
- program instructions programmed to synchronize the first transport trajectory and the second transport trajectory with an algorithm that uses discrete algebraic equations (DAEs);
- program instructions programmed to filter the DAEs by applying a "minimax" decision rule to a set of measurements from the first set of active sub-domains and the second set of active sub-domains; and
- program instructions programmed to predict a third transport trajectory by applying numerical integration to the filtered DAEs.

* * * * *